(12) United States Patent
Wang et al.

(10) Patent No.: US 11,133,363 B2
(45) Date of Patent: Sep. 28, 2021

(54) ARRAY SUBSTRATE AND MANUFACTURING METHOD THEREOF, AND DISPLAY DEVICE

(71) Applicant: BOE Technology Group Co., Ltd., Beijing (CN)

(72) Inventors: Ke Wang, Beijing (CN); Xinhong Lu, Beijing (CN); Hehe Hu, Beijing (CN); Wei Yang, Beijing (CN); Ce Ning, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/556,342

(22) Filed: Aug. 30, 2019

(65) Prior Publication Data

US 2020/0091263 A1    Mar. 19, 2020

(30) Foreign Application Priority Data

Sep. 17, 2018   (CN) .......................... 201811080383.2

(51) Int. Cl.
*H01L 27/32* (2006.01)
*H01L 27/12* (2006.01)
*H01L 29/40* (2006.01)
*H01L 29/417* (2006.01)
*H01L 29/423* (2006.01)

(52) U.S. Cl.
CPC ...... *H01L 27/3262* (2013.01); *H01L 27/1229* (2013.01); *H01L 27/1251* (2013.01); *H01L 27/1288* (2013.01); *H01L 29/401* (2013.01); *H01L 29/41733* (2013.01); *H01L 29/42384* (2013.01)

(58) Field of Classification Search
CPC ......... H01L 29/78642; H01L 29/42384; H01L 29/78675; H01L 29/7869; H01L 29/41733; H01L 29/401; H01L 27/1229; H01L 27/1225; H01L 27/1255; H01L 27/1288; H01L 27/3262; H01L 27/1248; H01L 27/1251
See application file for complete search history.

(56) References Cited

U.S. PATENT DOCUMENTS

2015/0243722 A1* 8/2015 Kwon ................. H01L 27/3272
                                                                    257/40
2018/0190931 A1* 7/2018 Jung .................... G09G 3/3225

* cited by examiner

*Primary Examiner* — Vongsavanh Sengdara
(74) *Attorney, Agent, or Firm* — Fay Sharpe LLP

(57) ABSTRACT

The present discloses an array substrate and a manufacturing method thereof, and a display device. The array substrate includes a first transistor and a second transistor. The first transistor includes a first active layer, a first gate, a first source and a first drain. The second transistor includes a second active layer, a second gate, a second source and a second drain. An orthographic projection of the second source on the base substrate and an orthographic projection of the second drain on the base substrate at least partially overlap. One of the second source and the second drain is in the same layer as and made from the same material as the first gate. The first source and the first drain are in the same layer as and made from the same material as the other of the second source and the second drain.

20 Claims, 13 Drawing Sheets

ARRAY SUBSTRATE AND MANUFACTURING METHOD THEREOF, AND DISPLAY DEVICE

CROSS-REFERENCE TO RELATED APPLICATION

This application claims priority to Chinese Patent Application No.: 201811080383.2, filed on Sep. 17, 2018 and entitled "ARRAY SUBSTRATE AND MANUFACTURING METHOD THEREOF, AND DISPLAY DEVICE", the entire contents of which are incorporated herein by reference.

TECHNICAL FIELD

The present disclosure relates to the field of display technology, and more particular to an array substrate and a manufacturing method thereof, and a display device.

BACKGROUND

Currently, an active-matrix organic light emitting diode (AMOLED) display is a new type of display in the market, and a pixel drive circuit in an AMOLED display usually includes a plurality of thin film transistors (TFTs) and a storage capacitor.

In general, at least one of the plurality of TFTs is a low temperature poly-silicon thin film transistor (LIPS TFT), and other TFTs are oxide TFTs. As the LIPS TFT has the advantage of a high mobility ratio and the oxide TFT has the advantage of relatively low current leakage, the power consumption of the AMOLED display that integrates the LIPS TFT and the oxide TFTs greatly reduces.

SUMMARY

The present disclosure provides an array substrate and a manufacturing method thereof, and a display device. The technical solutions are as follows.

In an aspect, there is provided an array substrate, comprising: a base substrate, and a first transistor and a second transistor on a side of the base substrate; wherein an orthographic projection of the first transistor on the base substrate and an orthographic projection of the second transistor on the base substrate are non-overlapped;

the first transistor comprises: a first active layer, a first gate, a first source and a first drain, wherein the first source and the first drain are in a same layer and are both in contact with the first active layer;

the second transistor comprises: a second active layer, a second gate, a second source and a second drain, wherein the second source and the second drain are on a side, close to the base substrate, of the second active layer and are both in contact with the second active layer, and the second source and the second drain are in different layers; an orthographic projection of the second source on the base substrate and an orthographic projection of the second drain on the base substrate at least partially overlap; and the second gate is on a side, away from the base substrate, of the second active layer; and structures in the first transistor and the second transistor meet at least one of following conditions:

the first gate, and one of the second source and the second drain are in a same layer and made from a same material; and the first source, the first drain and the other one of the second source and the second drain are in a same layer and made from a same material.

Optionally, a whole-layer structure formed of one of the second source and the second drain, and the first gate is on a side, away from the base substrate, of the first active layer.

Optionally, a whole-layer structure formed of one of the second source and the second drain, and the first gate is on a side, close to the base substrate, of the first active layer.

Optionally, an insulating layer with a first via-hole is between the second source and the second drain; one of the second source and the second drain close to the base substrate is exposed from the first via-hole, one of the second source and the second drain away from the base substrate is on the side, close to the base substrate, of the second active layer, and the second active layer electrically connects the second source to the second drain through the first via-hole.

Optionally, the second transistor further comprises: a second gate insulating layer;

in the first via-hole, the second gate insulating layer is on the side, away from the base substrate, of the second active layer, and the second gate is on a side, away from the base substrate, of the second gate insulating layer.

Optionally, the insulating layer has a thickness of more than or equal to 3000 Å.

Optionally, a material of the first active layer comprises: poly-silicon, and a material of the second active layer comprises an oxide semiconductor.

Optionally, the second transistor further comprises: a second gate insulating layer between the second active layer and the second gate; and the array substrate further comprises: a first auxiliary electrode and a second auxiliary electrode, wherein the first auxiliary electrode, the second auxiliary electrode and the second gate insulating layer form a storage capacitor;

the first auxiliary electrode, the first source, the first drain and the other one of the second source and the second drain are in a same layer and made from a same material; and the second auxiliary electrode and the second gate are in a same layer and made from a same material.

Optionally, the array substrate further comprises: a first planarization layer on a side, away from the base substrate, of the first source and the first drain, and a conductive electrode on a side, away from the base substrate, of the first planarization layer, wherein one of the first source and the first drain is electrically connected to the conductive electrode, and the conductive electrode and the second gate are in a same layer and made from a same material.

Optionally, the array substrate further comprises: a first data line and a second data line; wherein the first data line, the first source, the first drain, and the other one of the second source and the second drain are in a same layer and made from a same material; and the second data line and the second gate are in a same layer and made from a same material.

Optionally, the array substrate further comprises: a buffer layer on a side of the base substrate, and the first transistor and the second transistor on a side, away from the base substrate, of the buffer layer; wherein the first transistor comprises: the first active layer, a first gate insulating layer on a side, away from the base substrate, of the first active layer, the first gate on a side, away from the base substrate, of the first gate insulating layer, an insulating layer on a side, away from the base substrate, of the first gate, and the first source and the first drain on a side, away from the base substrate, of the insulating layer, wherein a second via-hole is in the insulating layer, the first source and the first drain are respectively electrically connected to the first active layer through the second via-hole, a material of the first active layer comprises poly-silicon, and the insulating layer has a thickness of more than or equal to 3000 Å;

the second transistor comprises: one of the second source and the second drain on the side, away from the base substrate, of the first gate insulating layer, the insulating layer on a side, away from the base substrate, of one of the second source and the second drain, the other one of the second source and the second drain on the side, away from the base substrate, of the insulating layer, the second active layer on a side, away from the base substrate, of the other one of the second source and the second drain, a second gate insulating layer on a side, away from the base substrate, of the second active layer, and the second gate on a side, away from the base substrate, of the second gate insulating layer, wherein a first via-hole is in the insulating layer, one of the second source and the second drain close to the base substrate is exposed from the first via-hole, the second active layer electrically connects the second source to the second drain through the first via-hole, and in the first via-hole, the second gate insulating layer is on the side, away from the base substrate, of the second active layer, and the second gate is on a side, away from the base substrate, of the second gate insulating layer, and a material of the second active layer comprises an oxide semiconductor;

the second gate insulating layer covers the first source and the first drain; the array substrate further comprises: a first planarization layer on the side, away from the base substrate, of the second gate insulating layer, and a conductive electrode on a side, away from the base substrate, of the first planarization layer, wherein one of the first source and the first drain is electrically connected to the conductive electrode;

the array substrate further comprises: a first auxiliary electrode, a second auxiliary electrode, a first data line and a second data line, wherein the first auxiliary electrode, the second auxiliary electrode and the second gate insulating layer form a storage capacitor;

wherein, the first gate and one of the second source and the second drain are in a same layer and made from a same material; the first source, the first drain, the first auxiliary electrode, the first data line, and the other one of the second source and the second drain are in a same layer and made from a same material; and the second gate, the second auxiliary electrode, the conductive electrode and the second data line are in a same layer and made from a same material.

12. The array substrate according to claim 1, further comprising: a buffer layer on a side of the base substrate, and the first transistor and the second transistor on a side, away from the base substrate, of the buffer layer; wherein the first transistor comprises: the first gate, a first gate insulating layer on a side, away from the base substrate, of the first gate, the first active layer on a side, away from the base substrate, of the first gate insulating layer, an insulating layer on a side, away from the base substrate, of the first active layer, and the first source and the first drain on a side, away from the base substrate, of the insulating layer, wherein a second via-hole is in the insulating layer, the first source and the first drain are respectively electrically connected to the first active layer through the second via-hole, a material of the first active layer comprises poly-silicon, and the insulating layer has a thickness of more than or equal to 3000 Å;

the second transistor comprises: one of the second source and the second drain on the side, away from the base substrate, of the first gate insulating layer, the insulating layer on a side, away from the base substrate, of one of the second source and the second drain, the other one of the second source and the second drain on the side, away from the base substrate, of the insulating layer, the second active layer on a side, away from the base substrate, of the other one of the second source and the second drain, a second gate insulating layer on a side, away from the base substrate, of the second active layer, and the second gate on a side, away from the base substrate, of the second gate insulating layer, wherein a first via-hole is in the insulating layer, one of the second source and the second drain close to the base substrate is exposed from the first via-hole, the second active layer electrically connects the second source to the second drain through the first via-hole, and in the first via-hole, the second gate insulating layer is on the side, away from the base substrate, of the second active layer, and the second gate is on a side, away from the base substrate, of the second gate insulating layer, and a material of the second active layer comprises an oxide semiconductor;

the second gate insulating layer covers the first source and the first drain; the array substrate further comprises: a first planarization layer on the side, away from the base substrate, of the second gate insulating layer, and a conductive electrode on a side, away from the base substrate, of the first planarization layer, wherein one of the first source and the first drain is electrically connected to the conductive electrode;

the array substrate further comprises: a first auxiliary electrode, a second auxiliary electrode, a first data line and a second data line, wherein the first auxiliary electrode, the second auxiliary electrode and the second gate insulating layer form a storage capacitor;

wherein, the first gate, and one of the second source and the second drain are in a same layer and made from a same material; the first source, the first drain, the first auxiliary electrode, the first data line, and the other one of the second source and the second drain are in a same layer and made from a same material; and the second gate, the second auxiliary electrode, the conductive electrode and the second data line are in a same layer and made from a same material.

Optionally, the array substrate is provided with a plurality of sub-pixel regions, and the first transistor and the second transistor are in each of the sub-pixel regions.

In another aspect, there is provided a method of manufacturing an array substrate, comprising:

forming a first active layer, a second active layer and a target conductive layer on a base substrate, to obtain a first transistor and a second transistor, wherein an orthographic projection of the first transistor on the base substrate and an orthographic projection of the second transistor on the base substrate are non-overlapped;

the first transistor comprises: a first active layer, a first gate, a first source and a first drain, wherein the first source and the first drain are in a same layer and are both in contact with the first active layer;

the second transistor comprises: a second active layer, a second gate, a second source and a second drain, wherein the second source and the second drain are on a side, close to the base substrate, of the second active layer, are both in contact with the second active layer, and the second source and the second drain are in different layers, an orthographic projection of the second source on the base substrate and an orthographic projection of the second drain on the base substrate at least partially overlap, and the second gate is on a side, away from the base substrate, of the second active layer; and the target conductive layer comprises: at least one of a first conductive pattern, a second conductive pattern and a third conductive pattern, wherein each conductive pattern in the target conductive layer is formed by a single patterning process after formation of a material layer, the first conductive pattern comprises: one of the second source and the second drain, as well as the first gate; the second conductive pattern comprises: the first source and the first drain, as well as the other one of the second source and the second drain; and the third conductive pattern comprises: the second gate.

Optionally, forming the first active layer, the second active layer and the target conductive layer on the base substrate, to form the first transistor and the second transistor comprises:

forming the first active layer and the first conductive pattern on the base substrate, wherein the first conductive pattern is formed by a single patterning process after formation of a first conductive material layer on the base substrate;

forming a second conductive material layer on the base substrate on which the first active layer and the first conductive pattern are formed;

processing the second conductive material layer by a single patterning process to form the second conductive pattern, to obtain a first transistor;

forming the second active layer on the base substrate on which the second conductive pattern is formed;

forming a third conductive material layer on the base substrate on which the second active layer is formed; and processing the third conductive material layer by a single patterning process to form the third conductive pattern, to obtain a second transistor.

Optionally, prior to forming the second conductive material layer on the base substrate on which the first active layer and the first conductive pattern are formed, the method further comprises:

forming an insulating layer on the base substrate on which the first active layer and the first conductive pattern are formed, wherein a first via-hole is in the insulating layer, and one of the second source and the second drain close to the base substrate is exposed from the first via-hole; and forming the second active layer on the base substrate on which the second conductive pattern is formed comprises:

forming the second active layer on a side, away from the insulating layer, of the second conductive pattern, such that the second active layer electrically connects the second source to the second drain through the first via-hole.

Optionally, after forming the second active layer on the base substrate on which the second conductive pattern is formed, the method further comprises:

forming a second gate insulating layer on the base substrate on which the second active layer is formed, such that in the first via-hole, the second gate insulating layer is on a side, away from the base substrate, of the second active layer; and forming the third conductive material layer on the base substrate on which the second active layer is formed comprises:

forming the third conductive material layer on the base substrate on which the second gate insulating layer is formed, such that in the first via-hole, the third conductive material layer is on a side, away from the base substrate, of the second gate insulating layer.

Optionally, a material of the first active layer comprises poly-silicon, and a material of the second active layer comprises an oxide semiconductor.

Optionally, after forming the second active layer on the base substrate on which the second conductive pattern is formed, the method further comprises:

forming a second gate insulating layer on the base substrate on which the second active layer is formed, such that in the first via-hole, the second gate insulating layer is on a side, away from the base substrate, of the second active layer;

forming the third conductive material layer on the base substrate on which the second active layer is formed comprises:

forming the third conductive material layer on the base substrate on which the second gate insulating layer is formed, such that in the first via-hole, the third conductive material layer is on a side, away from the base substrate, of the second gate insulating layer; and after forming the second gate insulating layer on the base substrate on which the second active layer is formed, the method further comprises:

forming a first planarization layer on the base substrate on which the second gate insulating layer is formed, wherein the third conductive pattern further comprises: a conductive electrode, which is electrically connected to one of the first source and the first drain through the first planarization layer and a via-hole in the second gate insulating layer;

a material of the first active layer comprises poly-silicon, a material of the second active layer comprises an oxide semiconductor, and the first conductive pattern further comprises: a first auxiliary electrode and a first data line, and the third conductive pattern further comprises: a second auxiliary electrode and a second data line; and the first auxiliary electrode, the second auxiliary electrode and the second gate insulating layer form a storage capacitor.

In yet another aspect, there is provided a display device, comprising: an array substrate, wherein the array substrate comprises: a base substrate, and a first transistor and a second transistor on a side of the base substrate; wherein an orthographic projection of the first transistor on the base substrate and an orthographic projection of the second transistor on the base substrate are non-overlapped;

the first transistor comprises: a first active layer, a first gate, a first source and a first drain, wherein the first source and the first drain are in a same layer and are both in contact with the first active layer;

the second transistor comprises: a second active layer, a second gate, a second source and a second drain, wherein the second source and the second drain are on a side, close to the base substrate, of the second active layer, and are both in contact with the second active layer, and the second source and the second drain are in different layers; an orthographic projection of the second source on the base substrate and an orthographic projection of the second drain on the base substrate at least partially overlap; and the second gate is on a side, away from the base substrate, of the second active layer; and structures in the first transistor and the second transistor meet at least one of following conditions:

the first gate, and one of the second source and the second drain are in a layer and made from a same material;

the first source, the first drain and the other one of the second source and the second drain are in a same layer and made from a same material.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The embodiments of the present disclosure will be described in detail below with reference to the accompanying drawings to present the objects, technical solutions and advantages more clearly.

As known to the inventors, although an AMOLED display that integrates an LTPS TFT and oxide TFTs can make use of the advantage of a high mobility ratio of the LTPS TFT and the advantage of relatively low current leakage of the oxide TFTs, the process of manufacturing an array substrate in the display is relatively complicated.

Figure 1:
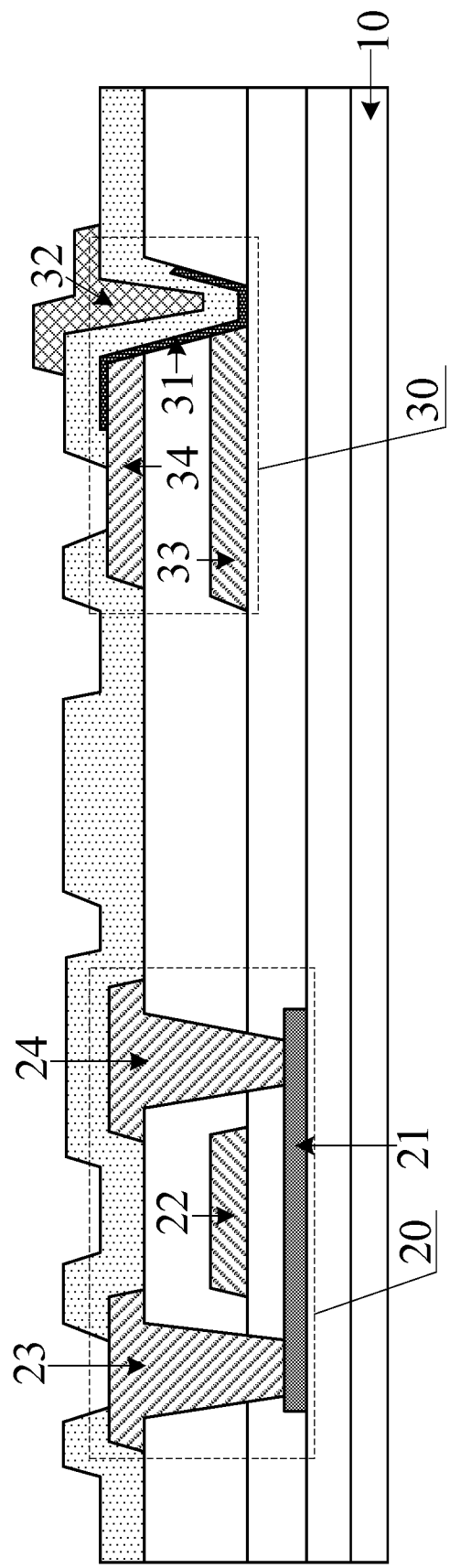
FIG. 1 is a schematic structural diagram of an array substrate according to an embodiment of the present disclosure.

An embodiment of the present disclosure provides an array substrate. As shown in FIG. 1 which is a schematic structural diagram of an array substrate according to the embodiment of the present disclosure, the array substrate may include a base substrate 10, as well as a first TFT 20 and a second TFT 30 on the base substrate 10. An orthographic projection of the first TFT on the base substrate and an orthographic projection of the second TFT on the base substrate are non-overlapped.

The first TFT 20 may include a first active layer 21, a first gate 22, a first source 23 and a first drain 24. The first source 23 and the first drain 24 are in the same layer and are both in contact with the first active layer 21.

The second TFT 30 may include a second active layer 31, a second gate 32, a second source 33 and a second drain 34. The second source 33 and the second drain 34 are on the side, close to the base substrate 10, of the second active layer 31, and are both in contact with the second active layer 31. The second source 33 and the second drain 34 are in different layers. An orthographic projection of the second source 33 on the base substrate 10 and an orthographic projection of the second drain 34 on the base substrate 10 at least partially overlap. The second gate 32 is on the side, away from the base substrate 10, of the second active layer 31.

Here, structures in the first TFT and the second TFT meet at least one of the following conditions.

One of the second source 33 and the second drain 34 is in the same layer as and made from the same material as the first gate 22. For the convenience of description, when one of the second source 33 and the second drain 34 is in the same layer as and made from the same material as the first gate 22, the layer which one of the second source 33 and the second drain 34 and the first gate 22 are on may be referred to as a first conductive pattern.

The first source 23, the first drain 24, and the other one of the second source 33 and the second drain 34 are in the same layer and made from the same material. For the convenience of description, when the first source 23, the first drain 24, and the other one of the second source 33 and the second drain 34 are in the same layer and made from the same material, the layer which the first source 23, the first drain 24 and the other one of the second source 33 and the second drain 34 are on may be referred to as a first conductive pattern.

Optionally, the first TFT 20 may be an LTPS TFT. That is, the material of the first active layer 21 in the first TFT 20 may include poly-silicon. The second TFT 30 may be an oxide TFT. That is, the material of the second active layer 31 in the second TFT 30 may include an oxide semiconductor. For example, the material of the second active layer 31 may be an oxide semiconductor material, such as indium gallium zinc oxide (IGZO) or an indium tin zinc oxide (ITZO).

Here, for the convenience of description, in the following text, one of the second source 33 and the second drain 34 is referred to as a first electrode, and the other one of the second source 33 and the second drain 34 is referred to as a second electrode. The present embodiments of the present disclosure are exemplarily illustrated by taking an example in which the second source 33 is referred to as the first electrode and the second drain 34 is referred to as the second electrode.

As known to the inventors, currently, at least five layers of conductive structures need to be formed in the array substrate in the AMOLED display that integrates the LTPS TFT and the oxide TFTs. The at least five layers of conductive structures are divided into a conductive structure where a gate of the LTPS TFT is, a conductive structure where a source and a drain of the LTPS TFT are, a conductive structure where a gate of the oxide TFT, and a conductive structure where a source and a drain of the oxide TFT are. Therefore, the process of manufacturing the array substrate is relatively complicated.

The array substrate in the embodiments of the present disclosure includes at least one layer of conductive structure. As shown in FIG. 1, the at least one layer of conductive structure includes at least one of the following conductive patterns: a first layer of conductive pattern that includes the first gate 22 and the second source 33, a second layer of conductive pattern that includes the first source 23, the first drain 24 and the second drain 34, and a third layer of conductive pattern that includes the second gate 32. Thus, there are fewer layers of conductive structures in the array substrate in the embodiments of the present disclosure. Therefore, the manufacturing process of the array substrate is relatively simple and the manufacturing cost of the array substrate effectively reduces.

Figure 2:
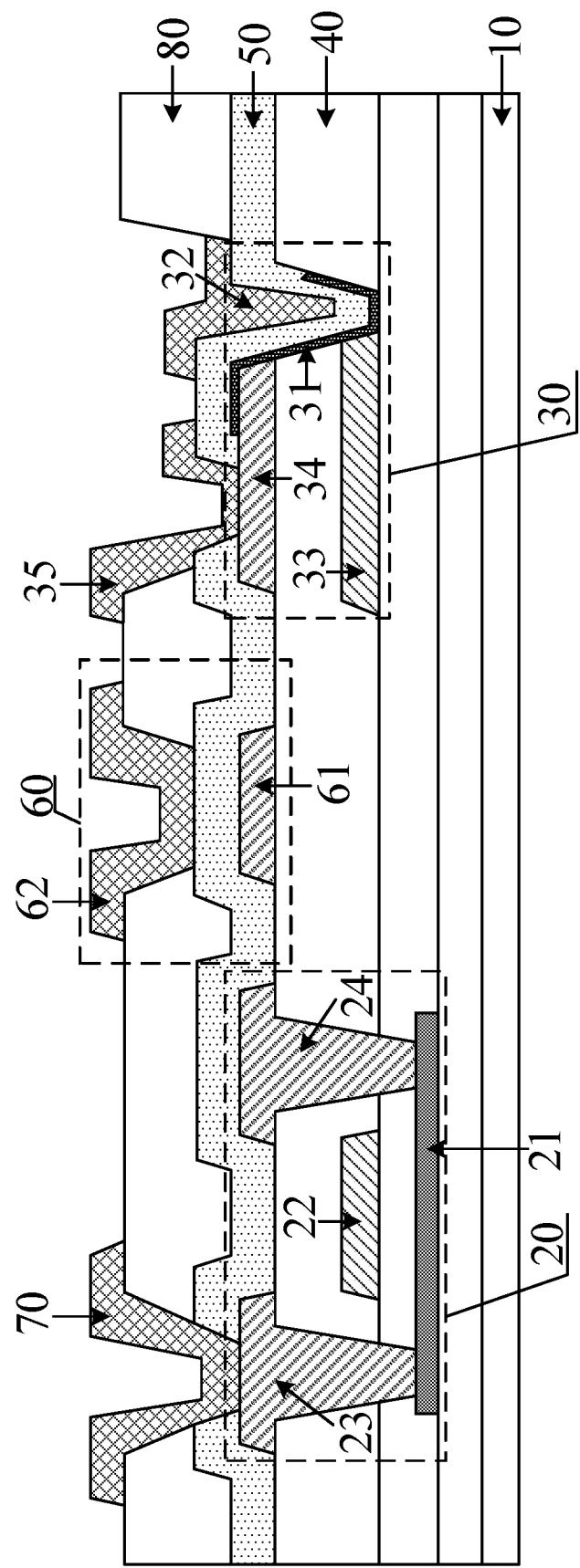
FIG. 2 is a schematic structural diagram of another array substrate according to an embodiment of the present disclosure.

As shown in FIG. 2 which is a schematic structural diagram of another array substrate according to an embodiment of the present disclosure, generally, an insulating layer 40 may be disposed between the first conductive pattern and the second conductive pattern, to insulate the first conductive pattern from the second conductive pattern. That is, the insulating layer 40 (also referred to as an interlayer dielectric layer) may be disposed on the first gate 22. By means of the insulating layer, short circuit may be avoided between the first gate 22 and the first source 23, or between the first gate 22 and the first drain 24. Besides, the insulating layer 40 may also be disposed between the second source 33 and the second drain 34. When the second transistor 30 is turned off, the insulating layer 40 can prevent short circuit from occurring between the second source 33 and the second drain 34.

Moreover, a first via-hole may be disposed in the insulating layer 40. One of the second source 33 and the second drain 34 (the second source 33 in FIG. 2) close to the base substrate is exposed from the first via-hole. In addition, one of the second source 33 and the second drain 34 away from the base substrate 10 is on the side, close to the base substrate 10, of the second active layer 31, such that the second active layer 31 electrically connects the second source 33 to the second drain 34 through the first via-hole.

For example, a side surface, close to the first via-hole, of the second source 33 may be exposed from the first via-hole. The second active layer 31 is on the side, close to the second source 33 and the second drain 34, in the first via-hole. That is, the second active layer 31 is electrically connected to the second source 33 and the second drain 34.

In the embodiments of the present disclosure, as shown in FIG. 2, a second gate insulating layer 50 may be disposed between the second active layer 31 and the second gate 32. Besides, in the first via-hole, the second active layer 31, the second gate insulating layer 50 and the second gate 32 may be sequentially laminated in a direction away from the base substrate 10. That is, the second gate insulating layer 50 is on the side, away from the base substrate 10, of the second active layer 31, and the second gate 32 is on the side, away from the base substrate 10, of the second gate insulating layer 50, such that the second gate 32 and the second active layer 31 have a big enough direct-facing area to guarantee electrical properties of the second transistor.

Optionally, the insulating layer 40 may have a thickness of more than or equal to 3000 Å. In this case, the first via-hole in the insulating layer 40 also has a depth of more than or equal to 3000 Å, such that a channel region in the second active layer 31 of the second transistor 30 has a width of more than or equal to 3000 Å. Thus, the second transistor 30 can be normally turned on or off under the action of the second gate 32.

Figure 3:
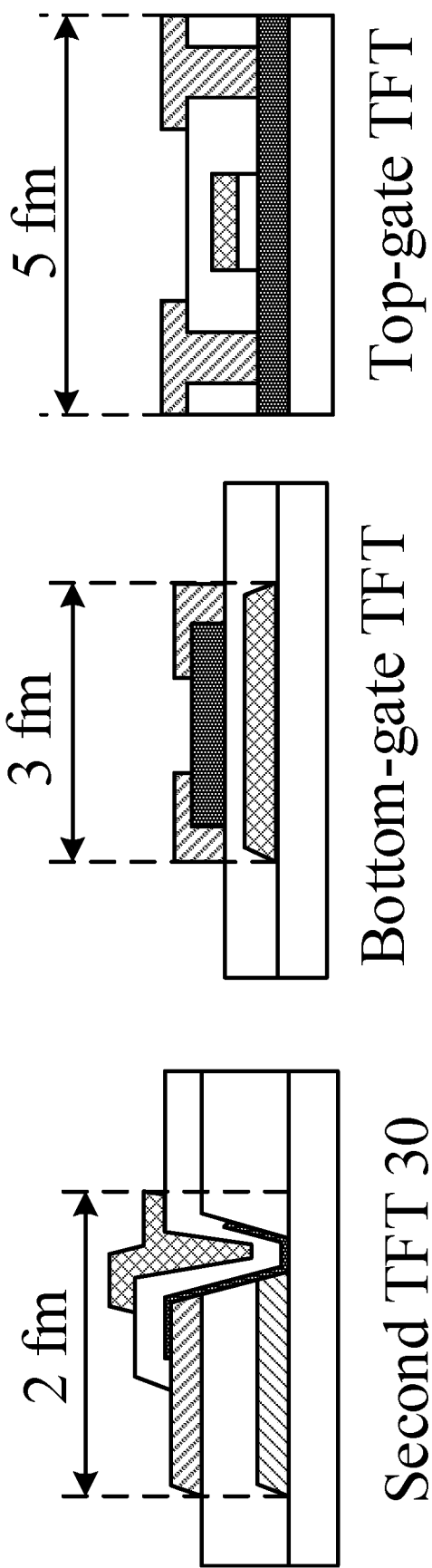
FIG. 3 is a diagram illustrating comparison of dimensions of a second transistor, a top-gate transistor and a bottom-gate transistor according to an embodiment of the present disclosure.

It can be known from the above that the second transistor 30 in the embodiments of the present disclosure is a vertical-type transistor, which does not belong to a top-gate transistor or a bottom-gate transistor. Thus, the dimension of the second transistor 30 is smaller than that of the top-gate transistor and the bottom-gate transistor. Exemplarily, referring to FIG. 3 which is a diagram showing comparison of dimensions of a second transistor, a top-gate transistor and a bottom-gate transistor according to an embodiment of the present disclosure, the second transistor 30 usually has a width of 2 fm, the top-gate transistor usually has a width of 5 fm and the bottom-gate transistor usually has a width of 3 fm. Therefore, the dimension of the second transistor 30 is smaller than that of the top-gate transistor and the bottom-gate transistor. In this case, the width of each sub-pixel region in an array substrate manufactured through the second transistor 30 may be appropriately reduced, to improve the number of pixels per inch (PPI) of the array substrate, which helps improve the resolution ratio of the display device.

Optionally, as shown in FIG. 2, the array substrate may further include a first auxiliary electrode 61 and a second auxiliary electrode 63 which are disposed on the base substrate 10. In order to simplify the manufacturing process of the array substrate, the first auxiliary electrode 61, the first source 23, the first drain 24 and the second electrode may be formed by processing one material layer through a single patterning process. That is, the first auxiliary electrode 61, the first source 23, the first drain 24 and the other one of the second source 33 and the second drain 34 are disposed in the same layer and made from the same material. The second auxiliary electrode 62 and the second gate 32 may be formed by processing one material layer through a single patterning process. That is, the second auxiliary electrode 62 and the second gate 32 are in the same layer and made from the same material. In this case, the second gate insulating layer 50 is disposed between the first auxiliary electrode 61 and the second auxiliary electrode 62, and the first auxiliary electrode 61, the second auxiliary electrode 62 and the second gate insulating layer 50 may form a storage capacitor 60.

It should be noted that the first transistor 20, the second transistor 30 and the storage capacitor 60 may be disposed in each sub-pixel region of the array substrate in the embodiments of the present disclosure, and the first transistor 20, the second transistor 30 and the storage capacitor 60 may form a drive circuit in the sub-pixel region.

Optionally, as shown in FIG. 2, the array substrate further includes a conductive electrode 70. One of the first source 23 and the first drain 24 in the first transistor 20 is electrically connected to the conductive electrode 70. In order to simplify the manufacturing process of the array substrate, the conductive electrode 70 and the second gate 32 may be formed by processing one material layer through a single patterning process. That is, the conductive electrode 70 and the second gate 32 are in the same layer and made from the same material. Besides, an anode in the AMOLED display may be electrically connected to the conductive electrode 70, such that the anode may be electrically connected to the first transistor 20, and the first transistor 20 may drive an organic light-emitting layer electrically connected to the anode to emit light.

Furthermore, as shown in FIG. 2, the array substrate may further include a first data line electrically connected to the first transistor 20 and a second data line 35 electrically connected to the second transistor 30. In order to simplify wiring in the array substrate, the first data line and the second data line need to be in different layers. In this case, the first data line may be formed at the same time when the first source 23 and the first drain 24 of the first transistor 20 are formed. That is, the first data line is disposed in the same layer as and made from the same material as the first source 23, the first drain 24 and the other one of the second source 33 and the second drain 34. The second data line 35 is formed at the same time when the conductive electrode 70 is formed. That is, the second data line 35 and the second gate 32 are in the same layer and made from the same material. In this case, the first data line may be insulated from the second data line 35 by the second gate insulating layer 50, which can effectively reduce the wiring difficulty in the array substrate.

Optionally, as shown in FIG. 2, the array substrate further includes a first planarization layer 80 disposed between the second gate insulating layer 50 and the second data line 35. The first planarization layer 80 can increase the thickness of a film layer playing a function of insulation between the first data line and the second data line 35. Thus, a shielding function of signals between the first data line and the second data line can be improved, and the probability of signal crosstalk between the two data lines reduces.

Figure 4:
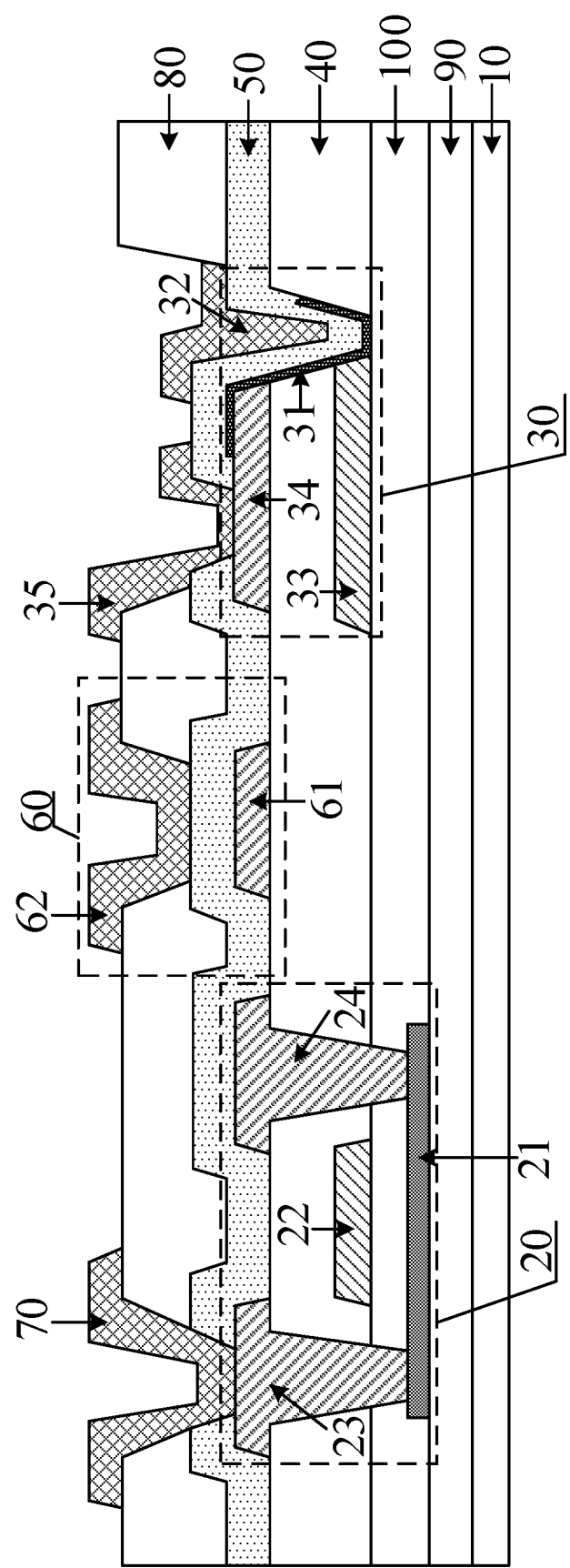
FIG. 4 is a schematic structural diagram of yet another array substrate according to an embodiment of the present disclosure.

It should be noted that the first transistor in the embodiments of the present disclosure may be a top-gate transistor and may also be a bottom-gate transistor. FIG. 4 is a schematic structural diagram of yet another array substrate according to an embodiment of the present disclosure. The first transistor in the array substrate is a top-gate transistor. As shown in FIG. 4, the array substrate may include a buffer layer 90, a first active layer 21, a first gate insulating layer 100, a first conductive pattern, an interlayer dielectric layer (i.e., the insulating layer 40 in FIG. 2), a second conductive pattern, a second active layer 31, a second gate insulating layer 50, a first planarization layer 80 and a third conductive pattern which are sequentially laminated on the base substrate 10 in a direction away from the base substrate.

The first conductive pattern includes a first gate 22 and a first electrode (i.e., the second source 33 in FIG. 4). The second conductive pattern includes a first source 23, a first drain 24, a second electrode (i.e., the second drain 34 in FIG. 4), a first auxiliary electrode 61 and a first data line. The third conductive pattern includes a second gate 32, a second auxiliary electrode 62, a conductive electrode 70 and a second data line 35.

Figure 5:
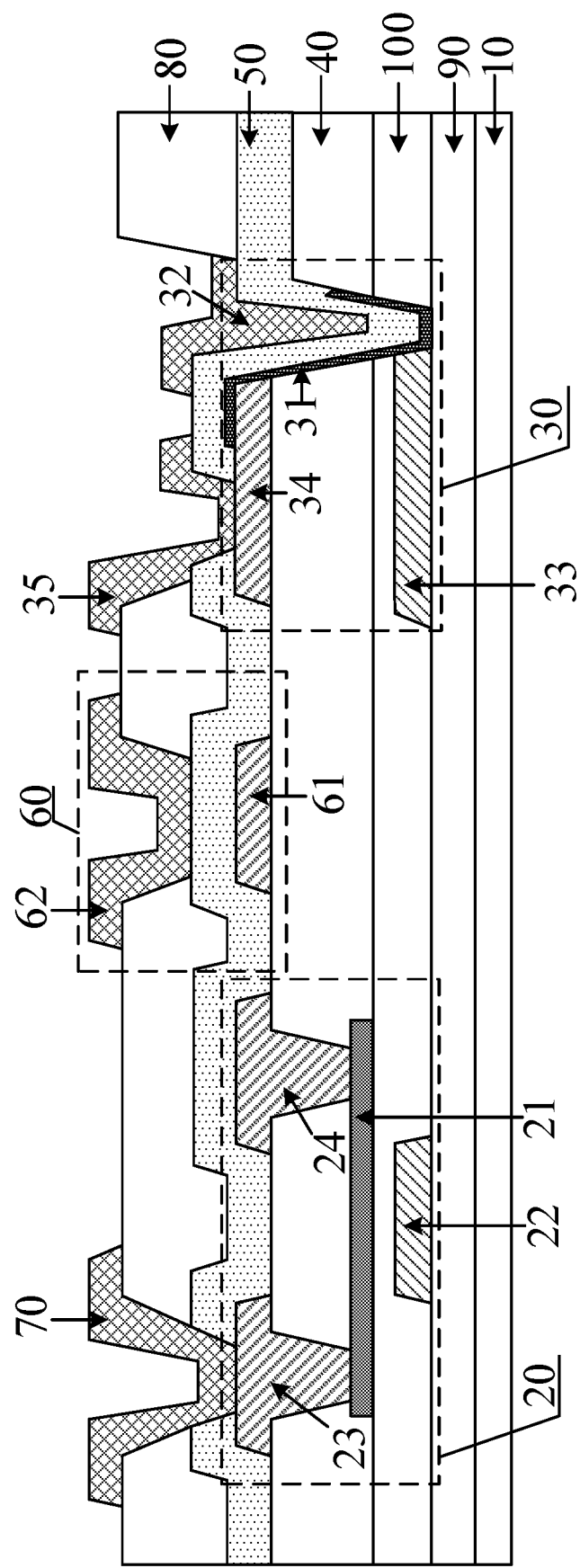
FIG. 5 is a schematic structural diagram of yet another array substrate according to an embodiment of the present disclosure.

FIG. 5 is a schematic structural diagram of yet another array substrate according to an embodiment of the present disclosure. The first transistor in the array substrate is a bottom-gate transistor. As shown in FIG. 5, the array substrate may include: a buffer layer 90, a first conductive pattern, a first gate insulating layer 100, a first active layer 21, an interlayer dielectric layer (i.e., an insulating layer 40), a second conductive pattern, a second active layer 31, a second gate insulating layer 50, a first planarization layer 80 and a third conductive pattern which are sequentially laminated on the base substrate 10 in a direction away from the base substrate 10.

The first conductive pattern includes a first gate 22 and a first electrode (i.e., the second source 33 in FIG. 5). The second conductive pattern includes a first source 23, a first drain 24, a second electrode (i.e., the second drain 34 in FIG. 5), a first auxiliary electrode 61 and a first data line. The third conductive pattern includes a second gate 32, a second auxiliary electrode 62, a conductive electrode 70 and a second data line 35.

In summary, in the array substrate provided in the embodiments of the present disclosure, the structures in the first transistor and the second transistor meet at least one of the following conditions: one of the second source and the second drain is disposed in the same layer as and made from the same material as the first gate; and the first source, and the first drain are in the same layer as and made from the same material as the other one of the second source and the second drain. Compared with the array substrate in which at least five layers of conductive structures need to be disposed in the related art, the array substrate provided in the embodiments needs fewer layers of conductive structures. The manufacturing process of the array substrate is relatively simple and relatively fewer conductive materials are needed for manufacturing the array substrate, which effectively reduces the manufacturing cost of the array substrate.

An embodiment of the present disclosure further provides a method of manufacturing an array substrate, which is applied to manufacture the array substrate provided in the present disclosure, for example, the array substrate shown in FIG. 1. The method may include: forming a first transistor and a second transistor on a base substrate. An orthographic projection of the first transistor on the base substrate and an orthographic projection of the second transistor on the base substrate are non-overlapped. Here, the first transistor includes a first active layer, a first gate, a first source and a first drain. The second transistor includes a second active layer, a second gate, a second source and a second drain. Correspondingly, the method may include: forming a first active layer, a second active layer and a target conductive layer on the base substrate, to obtain a first transistor and a second transistor. The first transistor includes the first active layer, a first gate, a first source and a first drain. The first source and the first drain are in the same layer and are both in contact with the first active layer.

The second transistor includes the second active layer, a second gate, a second source and a second drain. The second source and the second drain are on the side, close to the base substrate, of the second active layer, and are both in contact with the second active layer. In addition, the second source and the second drain are in different layers. An orthographic projection of the second source on the base substrate and an orthographic projection of the second drain on the base substrate at least partially overlap. The second gate is on the side, away from the base substrate, of the second active layer.

The target conductive layer includes at least one of a first conductive pattern, a second conductive pattern and a third conductive pattern. Each conductive pattern in the target conductive layer is formed by a single patterning process after formation of a material layer. The first conductive pattern includes the first gate and one of the second source and the second drain. The second conductive pattern includes the first source and the first drain, as well as the other one of the second source and the second drain. The third conductive pattern includes the second gate.

In summary, according to the method of manufacturing an array substrate provided in the embodiments of the present disclosure, the target conductive layer includes at least one of the first conductive pattern, the second conductive pattern and the third conductive pattern, and each conductive pattern in the target conductive layer is formed by a single patterning process. The first conductive pattern includes the first gate and one of the second source and the second drain, the second conductive pattern includes the first source and the first drain, as well as the other one of the second source and the second drain, and the third conductive pattern includes the second gate. Compared with the array substrate in which at least five layers of conductive structures need to be disposed in the related art, the array substrate provided in the embodiments needs fewer layers of conductive structures. Thus, the manufacturing process of the array substrate is relatively simple.

Figure 6:
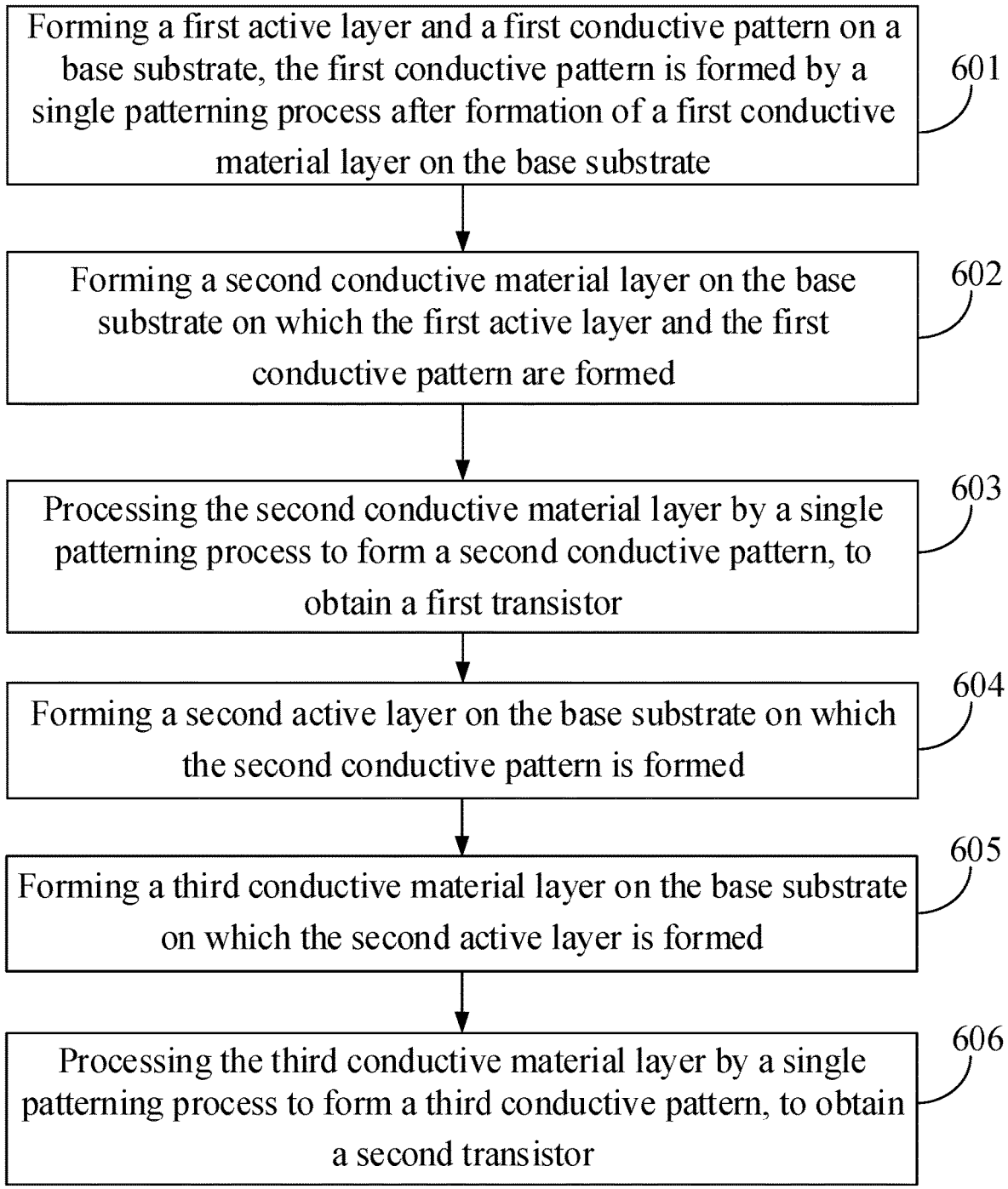
FIG. 6 is a flow chart of a method of manufacturing an array substrate according to an embodiment of the present disclosure.

The manufacturing method is described below by taking an example in which the target conductive layer includes the first conductive pattern, the second conductive pattern and the third conductive pattern. As shown in FIG. 6, the method may include the following steps.

In step 601, a first active layer and a first conductive pattern are formed on a base substrate. The first conductive pattern is formed by a single patterning process after formation of a first conductive material layer on the base substrate.

In step 602, a second conductive material layer is formed on the base substrate on which the first active layer and the first conductive pattern are formed.

In step 603, the second conductive material layer is processed by a single patterning process to form a second conductive pattern, to obtain a first transistor.

In step 604, a second active layer is formed on the base substrate on which the second conductive pattern is formed.

In step 605, a third conductive material layer is formed on the base substrate on which the second active layer is formed.

In step 606, the third conductive material layer is processed by a single patterning process to form a third conductive pattern, to obtain a second transistor.

Optionally, prior to step 602, the method may further include: forming an insulating layer on the base substrate on which the first active layer and the first conductive pattern are formed. A first via-hole is in the insulating layer, and one of the second source and the second drain close to the base substrate is exposed from the first via-hole.

Here, the above step 602 may include: forming a second conductive material layer on the base substrate on which the insulating layer is formed. Step 604 may include: forming a second active layer on the side, away from the insulating layer, of the second conductive pattern, such that the second active layer electrically connects the second source to the second drain through the first via-hole.

Moreover, after step 604, the method may further include: forming a second gate insulating layer on the base substrate on which the second active layer is formed, such that in the first via-hole, the second gate insulating layer is laminated on the side, away from the base substrate, of the second active layer.

Here, the above step 605 may include: forming a third conductive material layer on the base substrate on which the second gate insulating layer is formed, such that after step 606, in the first via-hole, the second gate can be laminated on the side, away from the base substrate, of the second gate insulating layer.

Optionally, the second conductive pattern further includes a first auxiliary electrode, and the third conductive pattern further includes a second auxiliary electrode. The first auxiliary electrode, the second gate insulating layer and the second auxiliary electrode form a storage capacitor.

Optionally, the third conductive pattern further includes a conductive electrode, to which one of the first source and the first drain is electrically connected.

Figure 7:
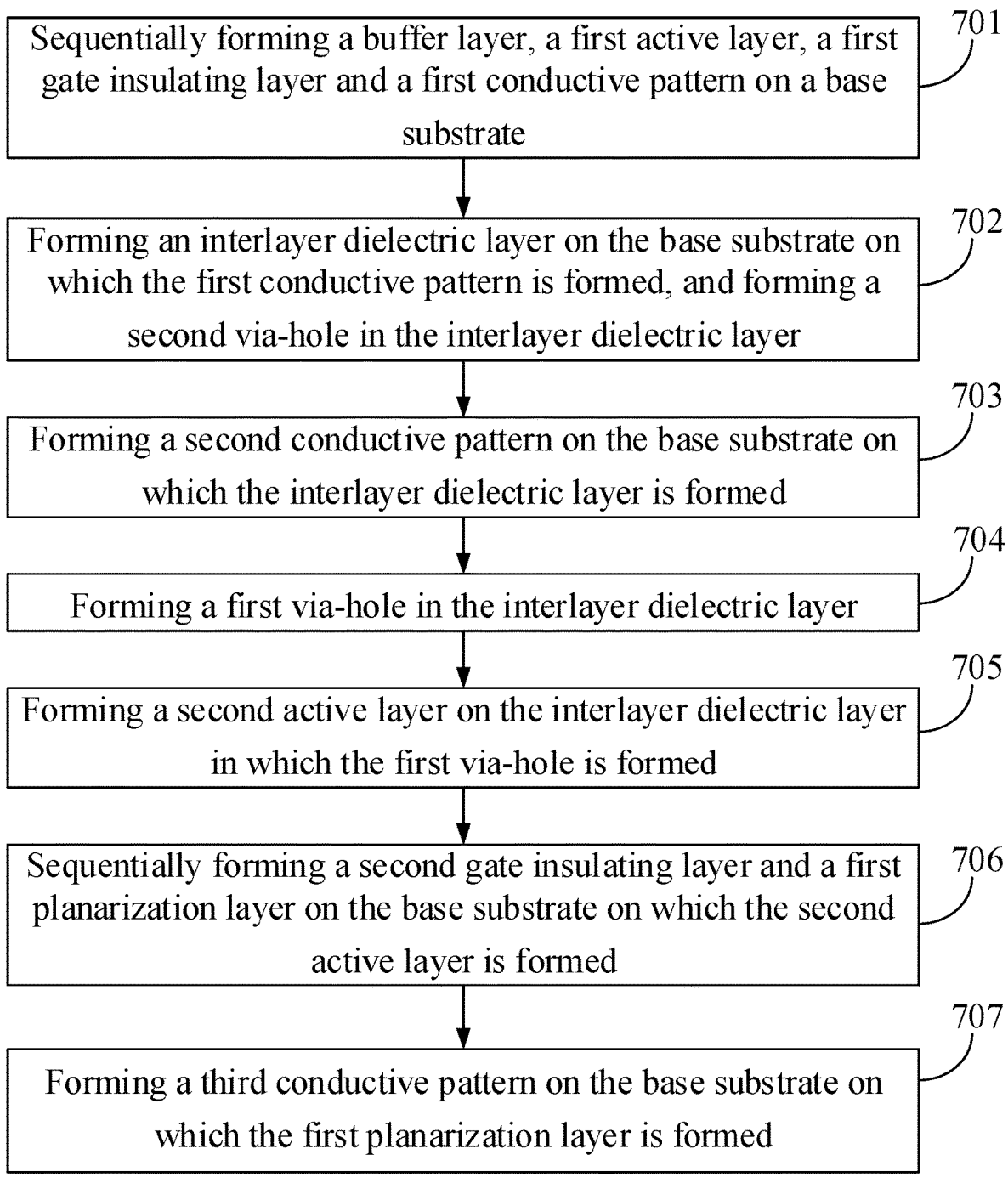
FIG. 7 is a flow chart of a method of manufacturing an array substrate according to an embodiment of the present disclosure.

Assuming that the first transistor formed on the base substrate is a top-gate transistor, referring to FIG. 7 which is a flow chart of a method of manufacturing an array substrate according to an embodiment of the present disclosure, which is applied to manufacture the array substrate shown in FIG. 4, the method may include the following steps.

In step 701, a buffer layer, a first active layer, a first gate insulating layer and a first conductive pattern are sequentially formed on a base substrate.

Optionally, the material of the buffer layer may include silicon dioxide, silicon nitride or a mixed material of silicon dioxide and silicon nitride. The material of the first active layer may include poly-silicon. The material of the first gate insulating layer may include silicon dioxide, silicon nitride or a mixed material of silicon dioxide and silicon nitride. The material of the first conductive pattern may include a metal material. For example, the first conductive pattern may be made from molybdenum (Mo), copper (Cu), aluminium (Al), or an alloy.

Figure 8:
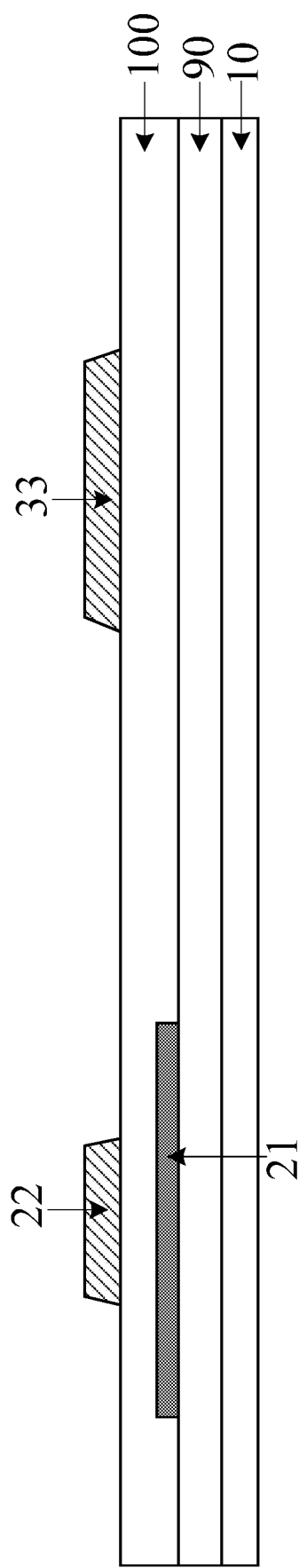
FIG. 8 is a schematic diagram after a buffer layer, a first active layer, a first gate insulating layer and a first conductive pattern are sequentially formed on an array substrate according to an embodiment of the present disclosure.

Exemplarily, as shown in FIG. 8, FIG. 8 is a schematic diagram after the buffer layer, the first active layer, the first gate insulating layer and the first conductive pattern are formed on the base substrate. The buffer layer 90 may be formed on the base substrate 10 by any means of deposition, coating, sputtering, etc.

Thereafter, a first active layer material layer is formed on the base substrate 10 on which the buffer layer 90 is formed by any means of deposition, coating, sputtering, etc. Then, a single patterning process is performed on the first active layer material layer to form the first active layer 21. The single patterning process may include photoresist coating, exposure, developing, etching and photoresist stripping.

Thereafter, the first gate insulating layer 100 is formed on the base substrate 10, on which the first active layer 21 is formed, by any means of deposition, coating, sputtering, etc.

Then, a first conductive material layer is formed on the base substrate 10, on which the first gate insulating layer 100 is formed, by any means of deposition, coating, sputtering, etc. Then, a single patterning process is performed on the first conductive material layer to form the first conductive pattern. Her, the first conductive pattern includes the first gate 22 and the second electrode (i.e., the second source 33 in FIG. 4).

In step 702, an interlayer dielectric layer is formed on the base substrate on which the first conductive pattern is formed, and a second via-hole is formed in the interlayer dielectric layer.

Optionally, the material of the interlayer dielectric layer may include silicon dioxide, silicon nitride or a mixed material of silicon dioxide and silicon nitride. The interlayer dielectric layer may have a thickness of more than or equal to 3000 Å.

Figure 9:
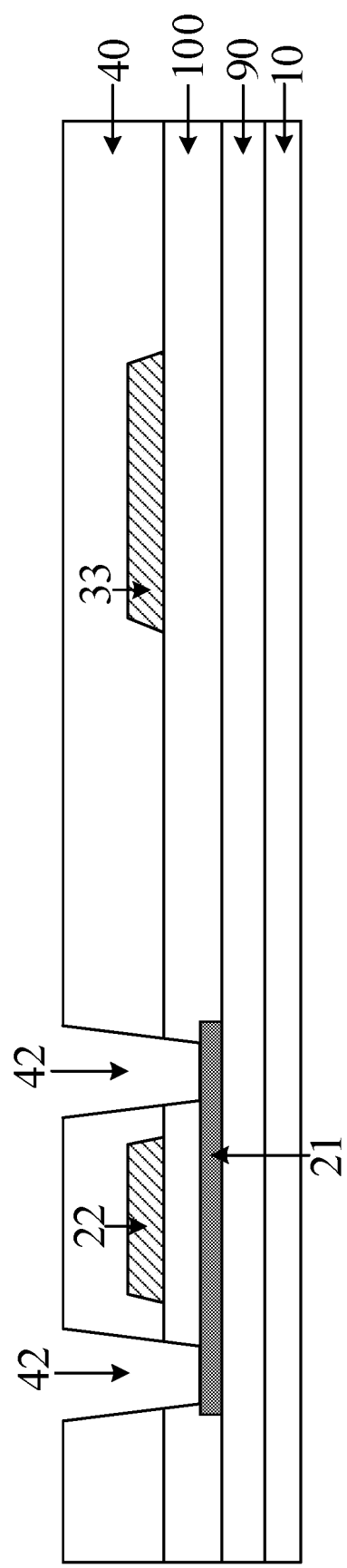
FIG. 9 is a schematic diagram after formation of an interlayer dielectric layer according to an embodiment of the present disclosure.

Exemplarily, as shown in FIG. 9 which is a schematic diagram after formation of the interlayer dielectric layer according to an embodiment of the present disclosure, the interlayer dielectric layer (i.e., the insulating layer 40 in the foregoing embodiments) may be formed on the base substrate 10 on which the first conductive pattern is formed, by any means of deposition, coating, sputtering, etc. Then, a single patterning process is performed on the interlayer dielectric layer, to form a second via-hole 42 in the interlayer dielectric layer. After formation of the first source and the first drain subsequently, both of the first source and the first drain can be electrically connected to the first active layer 21 through the second via-hole 42.

In step 703, a second conductive pattern is formed on the base substrate on which the interlayer dielectric layer is formed.

Optionally, the material of the second conductive pattern may include a metal. For example, the second conductive patter may be made from Mo, Cu, Al, or alloy.

Figure 10:
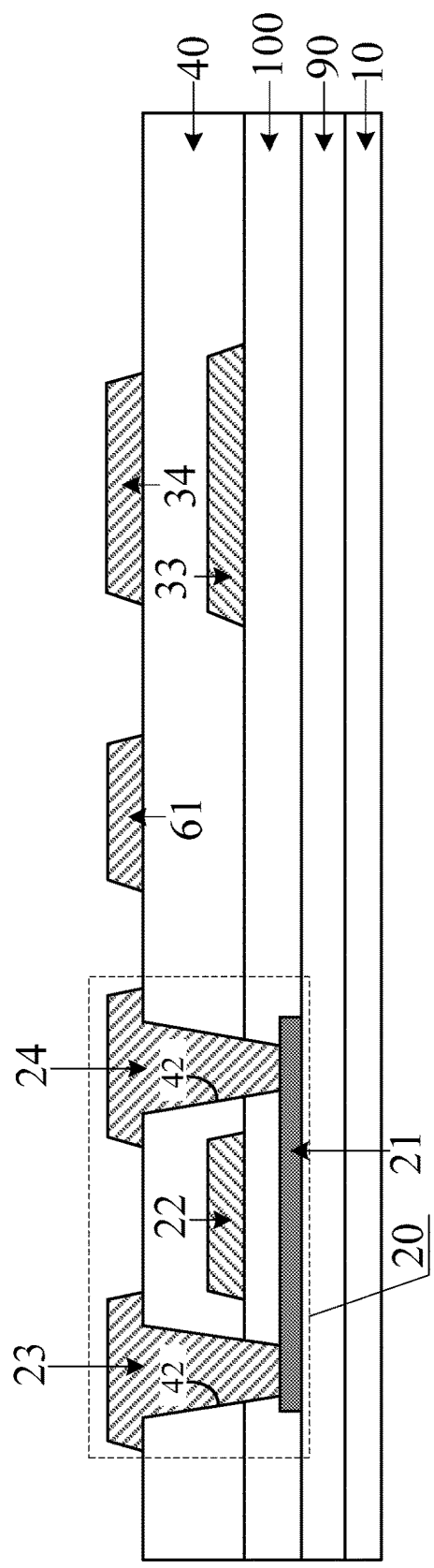
FIG. 10 is a schematic diagram after formation of a second conductive pattern according to an embodiment of the present disclosure.

Exemplarily, as shown in FIG. 10 which is a schematic diagram after formation of the second conductive pattern according to an embodiment of the present disclosure, a second conductive material layer may be formed on the base substrate 10, on which the interlayer dielectric layer is formed, by any means of deposition, coating, sputtering, etc. Then, a single patterning process is performed on the second conductive material layer to form the second conductive pattern.

The second conductive pattern may include a first source 23, a first drain 24, a first auxiliary electrode 61, a first data line and a second electrode (i.e., the second drain 34 in FIG. 4). The first source 23, the first drain 24, the first gate 22 and the first active layer 21 may form a first transistor 20. The first data line is electrically connected to first transistor 20.

It should be noted that prior to formation of the second conductive pattern, the first active layer 21 that is exposed from the bottom of the second via-hole 42 may be cleaned with hydrogen fluoride (HF), such that an oxide layer on the surface of the first active layer 21 is removed, to guarantee the electrical properties of the first active layer 21.

In step 704, a first via-hole is formed in the interlayer dielectric layer.

Figure 11:
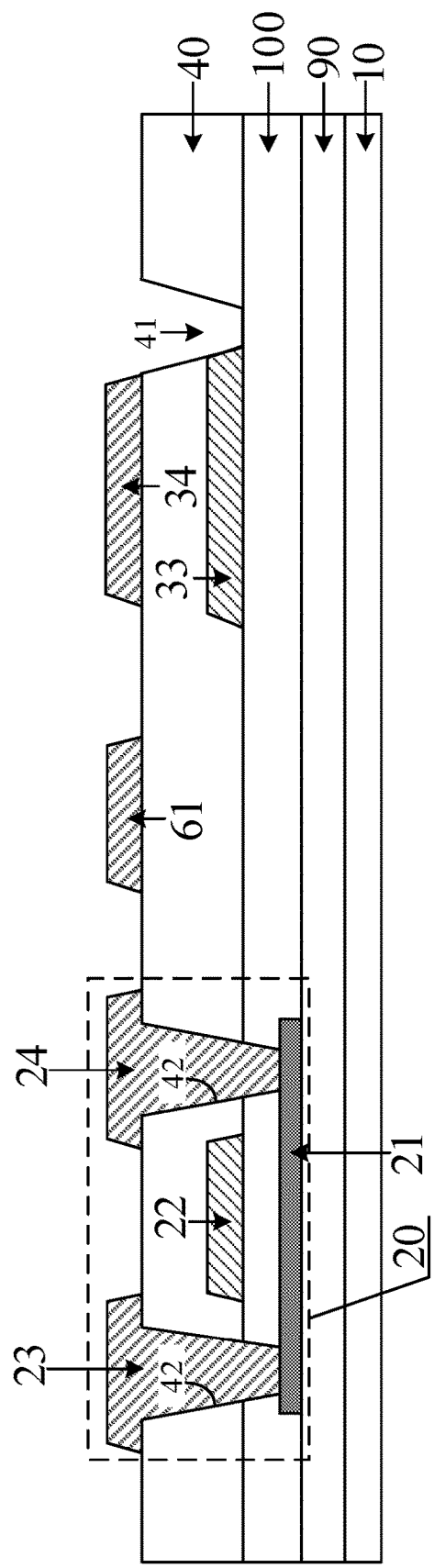
FIG. 11 is a schematic diagram after a first via-hole is formed in an interlayer dielectric layer according to an embodiment of the present disclosure.

Exemplarily, as shown in FIG. 11 which is a schematic diagram after formation of the first via-hole 41 in the interlayer dielectric layer according to an embodiment of the present disclosure, a single patterning process may be performed on the interlayer dielectric layer, to form the first via-hole 41 in the interlayer dielectric layer. Here, the side surfaces, close to the first via-hole 41, of the second source 33 and the second drain 34 may be exposed from the first via-hole 41.

Figure 12:
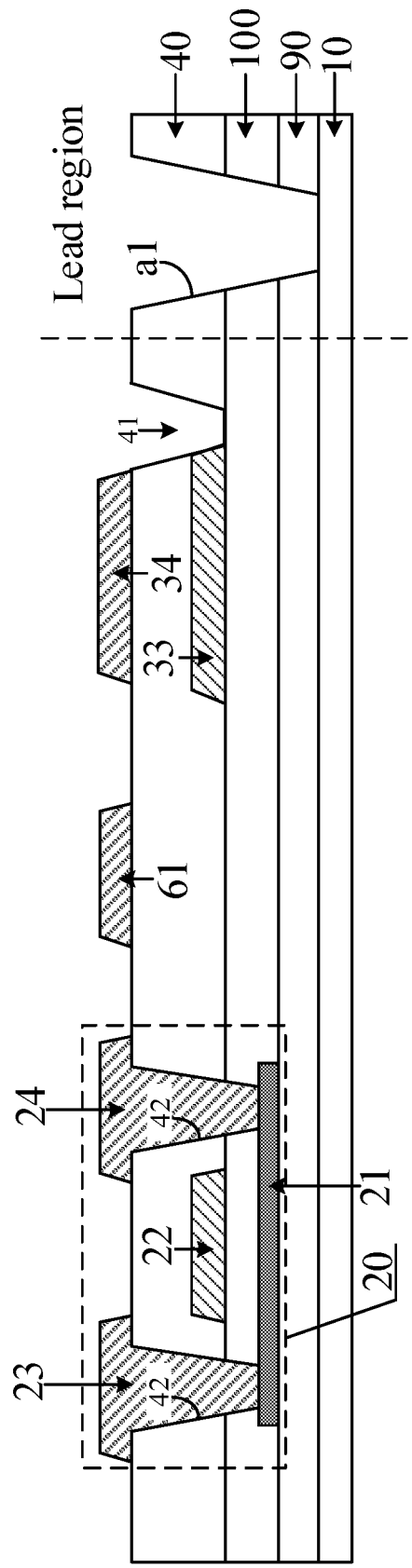
FIG. 12 is a schematic diagram obtained after a third via-hole is formed in a lead region of an array substrate according to an embodiment of the present disclosure.

It should be noted that if a bending process needs to be performed on the edge of the array substrate later, as film layers in the lead region are all made from inorganic materials with relatively strong bending stress, which is unfavorable for bending, a third via-hole may be further formed in the lead region, to facilitate bending of the lead region. The third via-hole passes through all the film layers in the lead region. Besides, an organic filler with relatively small bending stress may also be formed in the third via-hole, to facilitate bending of the lead region. Exemplarily, as shown in FIG. 12 which is a schematic diagram after formation of the third via-hole in the lead region of the array substrate according to an embodiment of the present disclosure, the third via-hole al needs to pass through the interlayer dielectric layer (i.e., the insulating layer 40), the first gate insulating layer 100 and the buffer layer 90 sequentially. As the third via-hole al is relatively deep, the patterning process needs to be performed twice to form the third via-hole al. One time of the pattering process may be the patterning process for forming the second via-hole 42 in step 702, and the other time of the patterning process may be the patterning process for forming the first via-hole 41 in step 704.

It should also be noted that if a being process does not need to be performed on the edge of the array substrate, the second via-hole formed in step 702 and the first via-hole formed in 704 may be simultaneously formed by a single patterning process, to further reduce the complexity in manufacturing the array substrate. Correspondingly, in the method of manufacturing the array substrate shown in FIG. 7, step 704 may not need to be executed. It should be noted supplementary that as the first via-hole and the second via-hole have different depths, during the single patterning process, exposure may be performed by adopting a halftone mask, to obtain the first via-hole and the second via-hole.

In step 705, a second active layer is formed on the interlayer dielectric layer in which the first via-hole is formed.

Optionally, the material of the second active layer may include an oxide semiconductor material, such as IGZO or ITZO, and the second active layer may have a thickness ranging from 200 Å to 1200 Å.

Figure 13:
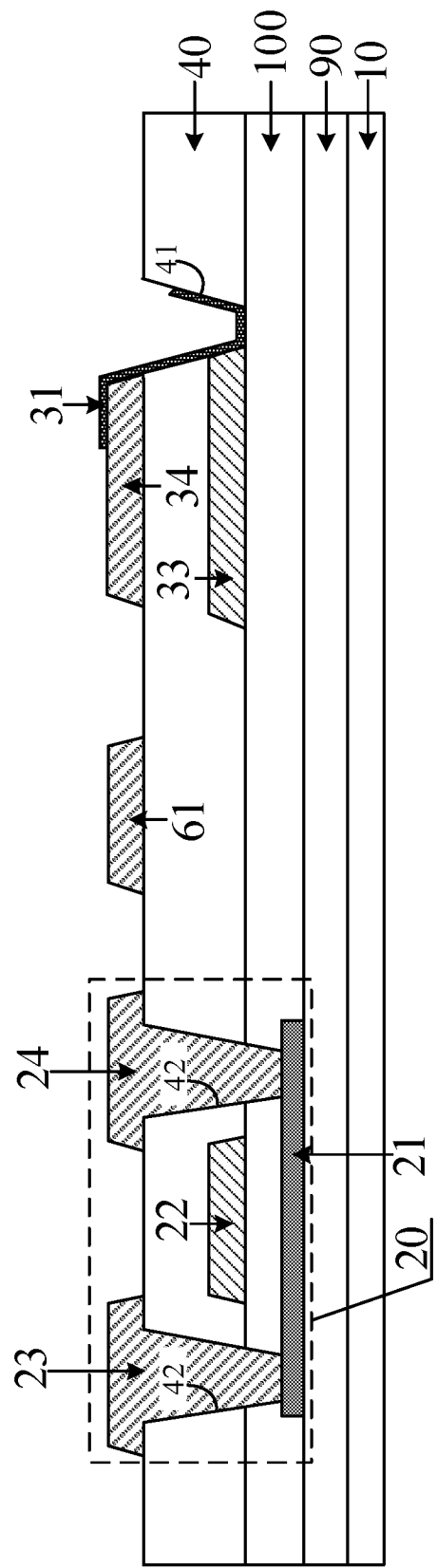
FIG. 13 is a schematic diagram after formation of a second active layer according to an embodiment of the present disclosure.

Exemplarily, as shown in FIG. 13 which is a schematic diagram after formation of the second active layer according to an embodiment of the present disclosure, a second active material layer may be formed on the interlayer dielectric layer, in which the first via-hole 41 is formed, by any means of deposition, coating, sputtering, etc. Then, a single patterning process is performed on the second active material layer to form the second active layer 31. The second active layer 31 may be on the side, close to the second source 33 and the second drain 34, in the first via-hole 41, such that the first active layer 31 is electrically connected to the second electrode (i.e., the second drain 34 in FIG. 4).

In step 706, a second gate insulating layer and a first planarization layer are sequentially formed on the base substrate on which the second active layer is formed.

Optionally, the material of the second gate insulating layer may include a material with a low content of hydrogen, for example, silicon dioxide, to guarantee the electrical properties of the second active layer. The material of the first planarization layer may include acrylic resin, epoxy resin or the like. The second gate insulating layer may have a thickness ranging from 1000 Å to 4000 Å.

Figure 14:
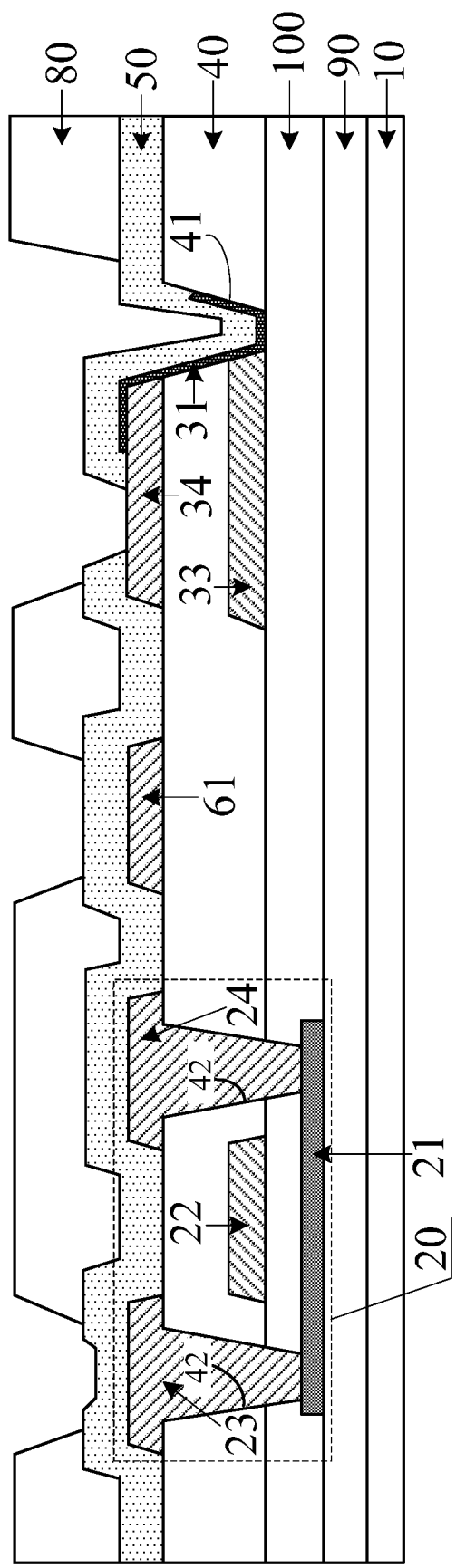
FIG. 14 is a schematic diagram after formation of a second gate insulating layer and a first planarization layer according to an embodiment of the present disclosure.

Exemplarily, as shown in FIG. 14 which is a schematic diagram after formation of the second gate insulating layer and the first planarization layer according to an embodiment of the present disclosure, a second gate insulating material layer may be formed on the base substrate 10, on which the second active layer 31 is formed, by any means of deposition, coating, sputtering, etc. Then, a single patterning process is performed on the second gate insulating material layer to form the second gate insulating layer 50.

Then, a first planarization material layer is formed on the base substrate 10, on which the second gate insulating layer 50 is formed, by any means of deposition, coating, sputtering, etc. Then, a single patterning process is performed on the first planarization material layer to form the first planarization layer 80.

In step 707, a third conductive pattern is formed on the base substrate on which the first planarization layer is formed.

Optionally, the material of the third conductive pattern may include a metal material. For example, the third conductive pattern may be made from Mo, Cu, Al, or alloy. Alternatively, the third conductive pattern may be formed of a titanium layer, an aluminium layer and a titanium layer which are laminated.

Figure 15:
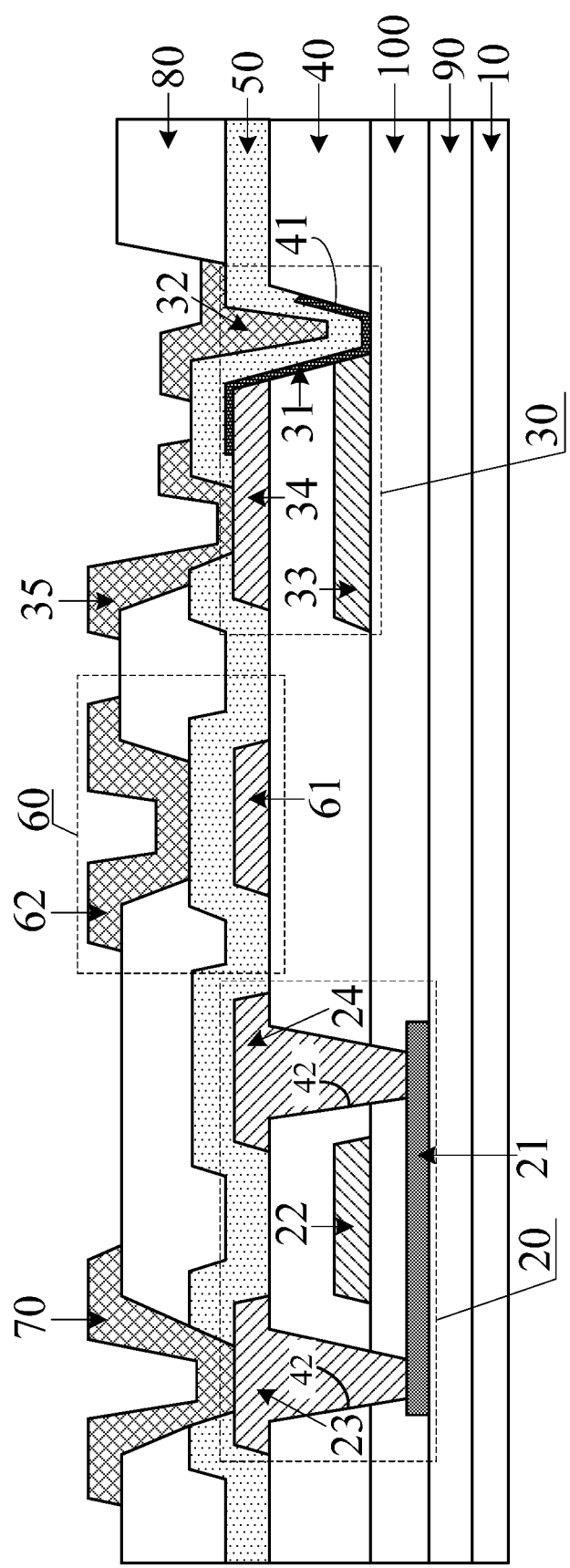
FIG. 15 is a schematic diagram after formation of a third conductive pattern according to an embodiment of the present disclosure.

Exemplarily, as shown in FIG. 15 which is a schematic diagram after formation of the third conductive pattern, a third conductive material layer may be formed on the base substrate 10, on which the first planarization layer 80 is formed, by any means of deposition, coating, sputtering, etc. Then, a single patterning process is performed on the third conductive material layer to form the third conductive pattern.

The third conductive pattern may include a conductive electrode 70, a second auxiliary electrode 62, a second gate 32 and a second data line 35. The second active layer 31, the second gate 32, the second source 33 and the second drain 34 may form a second transistor 30. The second auxiliary electrode 62, the second gate insulating layer 50 and the first auxiliary electrode 61 may form a storage capacitor 60. The second data line 35 is electrically connected to the second transistor 30.

The above step 701 and step 707 are the processes of implementing the method of manufacturing the first transistor that is a top-gate transistor. When the first transistor is a bottom-gate transistor, reference may be made to referring to step 701 to step 707 accordingly for the manufacturing method thereof, which is not be repeated here.

With the method of manufacturing the array substrate provided in the embodiments of the present disclosure, the number of times of the patterning process during the manufacturing process can be effectively reduced. For example, the total number of times of the patterning process for the film layers in the array substrate can be reduced to 12. Here, the total number of times of the patterning process for the conductive patterns is 3. Thus, the manufacturing process of the array substrate can be effectively simplified.

Those skilled in the art can clearly know that for the convenience and conciseness of description, reference may be made to the corresponding contents in the foregoing embodiments about the structures of the array substrate for specific principles of the above-described array substrate, which are not be repeated here.

In summary, according to the method of manufacturing the array substrate provided in the embodiments of the present disclosure, the target conductive layer includes at least one of the first conductive pattern, the second conductive pattern and the third conductive pattern, and each conductive pattern in the target conductive layer is formed by a single patterning process. The first conductive pattern includes the first gate and one of the second source and the second drain, the second conductive pattern includes the first source and the first drain, as well as the other one of the second source and the second drain, and the third conductive pattern includes the second gate. Compared with the array substrate in which at least five layers of conductive structures need to be disposed in the related art, the array substrate provided in the embodiments needs fewer layers of conductive structures. The manufacturing process of the array substrate is relatively simple, which effectively saves the capacity of the array substrate. Besides, relatively fewer conductive materials are needed for manufacturing the array substrate, which effectively reduces the manufacturing cost of the array substrate.

An embodiment of the present disclosure further provides a display panel, which may include the array substrate shown in FIG. 1, FIG. 2, FIG. 4 or FIG. 5.

Figure 16:
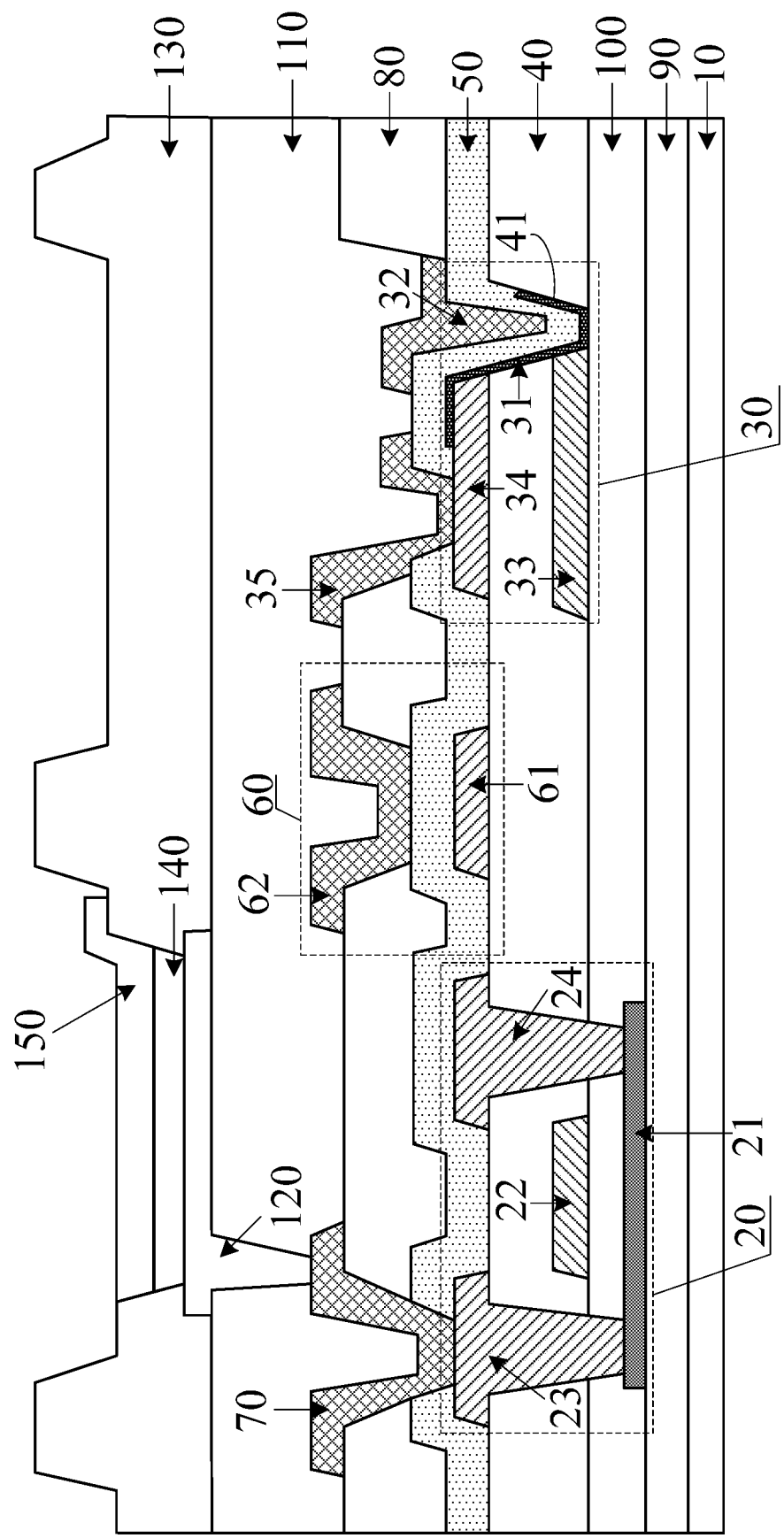
FIG. 16 is a schematic structural diagram of a display panel according to an embodiment of the present disclosure.

Optionally, as shown in FIG. 16 which is a schematic structural diagram of a display panel according to an embodiment of the present disclosure. The display panel may further include a second planarization layer 110, an anode 120, a pixel defining layer 130, an organic light-emitting layer 140, a cathode 150 and a support pillar which are laminated on the conductive electrode 70. The anode 120 is electrically connected to the conductive electrode 70. The pixel defining layer 130 and the support pillar may be manufactured by a halftone mask.

An embodiment of the present disclosure further provides a display device that may include the display panel shown in FIG. 16. The display device can be any product or component having a display function, such as electronic paper, a mobile phone, a tablet computer, a television, a display, a laptop, a digital photo frame or a navigator. Exemplarily, the display device may be an AMOLED display.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An array substrate, comprising: a base substrate, and a first transistor and a second transistor on a side of the base substrate; wherein
    an orthographic projection of the first transistor on the base substrate and an orthographic projection of the second transistor on the base substrate are non-overlapped;
    the first transistor comprises: a first active layer, a first gate, a first source and a first drain, wherein the first source and the first drain are obtained by a single patterning process and are both in contact with the first active layer;
    the second transistor comprises: a second active layer, a second gate, a second source and a second drain, wherein the second source and the second drain are on a side, close to the base substrate, of the second active layer and are both in direct contact with the second active layer, and the second source and the second drain are in different layers, an orthographic projection of the second source on the base substrate and an orthographic projection of the second drain on the base substrate at least partially overlap, and the second gate is on a side, away from the base substrate, of the second active layer; and
    structures in the first transistor and the second transistor meet at least one of following conditions:
    the first gate, and one of the second source and the second drain are obtained by a single patterning process and made from a same material; and
    the first source, the first drain and the other one of the second source and the second drain are obtained by a single patterning process and made from a same material.

2. The array substrate according to claim 1, wherein a whole-layer structure formed of one of the second source and the second drain, and the first gate is on a side, away from the base substrate, of the first active layer.

3. The array substrate according to claim 1, wherein a whole-layer structure formed of one of the second source and the second drain, and the first gate is on a side, close to the base substrate, of the first active layer.

4. The array substrate according to claim 1, wherein an insulating layer with a first via-hole is between the second source and the second drain;
    one of the second source and the second drain close to the base substrate is exposed from the first via-hole, one of the second source and the second drain away from the base substrate is on the side, close to the base substrate, of the second active layer, and the second active layer electrically connects the second source to the second drain through the first via-hole.

5. The array substrate according to claim 4, wherein the second transistor further comprises: a second gate insulating layer;
in the first via-hole, the second gate insulating layer is on the side, away from the base substrate, of the second active layer, and the second gate is on a side, away from the base substrate, of the second gate insulating layer.

6. The array substrate according to claim 1, wherein a material of the first active layer comprises: poly-silicon, and a material of the second active layer comprises an oxide semiconductor.

7. The array substrate according to claim 1, wherein the second transistor further comprises: a second gate insulating layer between the second active layer and the second gate;
and the array substrate further comprises: a first auxiliary electrode and a second auxiliary electrode, wherein the first auxiliary electrode, the second auxiliary electrode and the second gate insulating layer form a storage capacitor;
the first auxiliary electrode, the first source, the first drain and the other one of the second source and the second drain are obtained by a single patterning process and made from a same material; and
the second auxiliary electrode and the second gate are obtained by a single patterning process and made from a same material.

8. The array substrate according to claim 1, further comprising: a first planarization layer on a side, away from the base substrate, of the first source and the first drain, and a conductive electrode on a side, away from the base substrate, of the first planarization layer, wherein one of the first source and the first drain is electrically connected to the conductive electrode, and the conductive electrode and the second gate are obtained by a single patterning process and made from a same material.

9. The array substrate according to claim 1, further comprising: a first data line and a second data line; wherein
the first data line, the first source, the first drain, and the other one of the second source and the second drain are obtained by a single patterning process and made from a same material;
and the second data line and the second gate are obtained by a single patterning process and made from a same material.

10. The array substrate according to claim 1, further comprising: a buffer layer on a side of the base substrate, and the first transistor and the second transistor on a side, away from the base substrate, of the buffer layer; wherein
the first transistor comprises: the first active layer, a first gate insulating layer on a side, away from the base substrate, of the first active layer, the first gate on a side, away from the base substrate, of the first gate insulating layer, an insulating layer on a side, away from the base substrate, of the first gate, and the first source and the first drain on a side, away from the base substrate, of the insulating layer, wherein a second via-hole is in the insulating layer, the first source and the first drain are respectively electrically connected to the first active layer through the second via-hole, a material of the first active layer comprises poly-silicon, and the insulating layer has a thickness of more than or equal to 3000 Å;
the second transistor comprises: one of the second source and the second drain on the side, away from the base substrate, of the first gate insulating layer, the insulating layer on a side, away from the base substrate, of one of the second source and the second drain, the other one of the second source and the second drain on the side, away from the base substrate, of the insulating layer, the second active layer on a side, away from the base substrate, of the other one of the second source and the second drain, a second gate insulating layer on a side, away from the base substrate, of the second active layer, and the second gate on a side, away from the base substrate, of the second gate insulating layer, wherein a first via-hole is in the insulating layer, one of the second source and the second drain close to the base substrate is exposed from the first via-hole, the second active layer electrically connects the second source to the second drain through the first via-hole, and in the first via-hole, the second gate insulating layer is on the side, away from the base substrate, of the second active layer, and the second gate is on a side, away from the base substrate, of the second gate insulating layer, and a material of the second active layer comprises an oxide semiconductor;
the second gate insulating layer covers the first source and the first drain; the array substrate further comprises: a first planarization layer on the side, away from the base substrate, of the second gate insulating layer, and a conductive electrode on a side, away from the base substrate, of the first planarization layer, wherein one of the first source and the first drain is electrically connected to the conductive electrode;
the array substrate further comprises: a first auxiliary electrode, a second auxiliary electrode, a first data line and a second data line, wherein the first auxiliary electrode, the second auxiliary electrode and the second gate insulating layer form a storage capacitor;
wherein, the first gate and one of the second source and the second drain are obtained by a single patterning process and made from a same material; the first source, the first drain, the first auxiliary electrode, the first data line, and the other one of the second source and the second drain are obtained by a single patterning process and made from a same material; and the second gate, the second auxiliary electrode, the conductive electrode and the second data line are obtained by a single patterning process and made from a same material.

11. The array substrate according to claim 1, further comprising: a buffer layer on a side of the base substrate, and the first transistor and the second transistor on a side, away from the base substrate, of the buffer layer; wherein
the first transistor comprises: the first gate, a first gate insulating layer on a side, away from the base substrate, of the first gate, the first active layer on a side, away from the base substrate, of the first gate insulating layer, an insulating layer on a side, away from the base substrate, of the first active layer, and the first source and the first drain on a side, away from the base substrate, of the insulating layer, wherein a second via-hole is in the insulating layer, the first source and the first drain are respectively electrically connected to the first active layer through the second via-hole, a material of the first active layer comprises poly-silicon, and the insulating layer has a thickness of more than or equal to 3000 Å;
the second transistor comprises: one of the second source and the second drain on the side, away from the base substrate, of the first gate insulating layer, the insulating layer on a side, away from the base substrate, of one of the second source and the second drain, the other one of the second source and the second drain on the side, away from the base substrate, of the insulating layer, the second active layer on a side, away from the base substrate, of the other one of the second source and the second drain, a second gate insulating layer on a side, away from the base substrate, of the second active layer, and the second gate on a side, away from the base substrate, of the second gate insulating layer, wherein a first via-hole is in the insulating layer, one of the second source and the second drain close to the base substrate is exposed from the first via-hole, the second active layer electrically connects the second source to the second drain through the first via-hole, and in the first via-hole, the second gate insulating layer is on the side, away from the base substrate, of the second active layer, and the second gate is on a side, away from the base substrate, of the second gate insulating layer, and a material of the second active layer comprises an oxide semiconductor;

the second gate insulating layer covers the first source and the first drain; the array substrate further comprises: a first planarization layer on the side, away from the base substrate, of the second gate insulating layer, and a conductive electrode on a side, away from the base substrate, of the first planarization layer, wherein one of the first source and the first drain is electrically connected to the conductive electrode;

the array substrate further comprises: a first auxiliary electrode, a second auxiliary electrode, a first data line and a second data line, wherein the first auxiliary electrode, the second auxiliary electrode and the second gate insulating layer form a storage capacitor;

wherein, the first gate, and one of the second source and the second drain are obtained by a single patterning process and made from a same material; the first source, the first drain, the first auxiliary electrode, the first data line, and the other one of the second source and the second drain are obtained by a single patterning process and made from a same material; and the second gate, the second auxiliary electrode, the conductive electrode and the second data line are obtained by a single patterning process and made from a same material.

12. The array substrate according to claim 1, wherein the array substrate is provided with a plurality of sub-pixel regions, and the first transistor and the second transistor are in each of the sub-pixel regions.

13. The array substrate according to claim 1, wherein both the second source and the second drain are between the active second layer and the base substrate.

14. A method of manufacturing an array substrate, comprising:

forming a first active layer, a second active layer and a target conductive layer on a base substrate, to obtain a first transistor and a second transistor, wherein an orthographic projection of the first transistor on the base substrate and an orthographic projection of the second transistor on the base substrate are non-overlapped;

the first transistor comprises: a first active layer, a first gate, a first source and a first drain, wherein the first source and the first drain are obtained by a single patterning process and are both in contact with the first active layer;

the second transistor comprises: a second active layer, a second gate, a second source and a second drain, wherein the second source and the second drain are on a side, close to the base substrate, of the second active layer, are both in direct contact with the second active layer, and the second source and the second drain are in different layers, an orthographic projection of the second source on the base substrate and an orthographic projection of the second drain on the base substrate at least partially overlap, and the second gate is on a side, away from the base substrate, of the second active layer; and the target conductive layer comprises: at least one of a first conductive pattern, a second conductive pattern and a third conductive pattern, wherein each conductive pattern in the target conductive layer is formed by a single patterning process after formation of a material layer, the first conductive pattern comprises: one of the second source and the second drain, as well as the first gate; the second conductive pattern comprises: the first source and the first drain, as well as the other one of the second source and the second drain; and the third conductive pattern comprises: the second gate.

15. The method according to claim 14, wherein forming the first active layer, the second active layer and the target conductive layer on the base substrate, to form the first transistor and the second transistor comprises:

forming the first active layer and the first conductive pattern on the base substrate, wherein the first conductive pattern is formed by a single patterning process after formation of a first conductive material layer on the base substrate;

forming a second conductive material layer on the base substrate on which the first active layer and the first conductive pattern are formed;

processing the second conductive material layer by a single patterning process to form the second conductive pattern, to obtain a first transistor;

forming the second active layer on the base substrate on which the second conductive pattern is formed;

forming a third conductive material layer on the base substrate on which the second active layer is formed; and processing the third conductive material layer by a single patterning process to form the third conductive pattern, to obtain a second transistor.

16. The method according to claim 15, wherein prior to forming the second conductive material layer on the base substrate on which the first active layer and the first conductive pattern are formed, the method further comprises:

forming an insulating layer on the base substrate on which the first active layer and the first conductive pattern are formed, wherein a first via-hole is in the insulating layer, and one of the second source and the second drain close to the base substrate is exposed from the first via-hole; and forming the second active layer on the base substrate on which the second conductive pattern is formed comprises:

forming the second active layer on a side, away from the insulating layer, of the second conductive pattern, such that the second active layer electrically connects the second source to the second drain through the first via-hole.

17. The method according to claim 16, wherein after forming the second active layer on the base substrate on which the second conductive pattern is formed, the method further comprises:

forming a second gate insulating layer on the base substrate on which the second active layer is formed, such that in the first via-hole, the second gate insulating layer is on a side, away from the base substrate, of the second active layer;

forming the third conductive material layer on the base substrate on which the second active layer is formed comprises:

forming the third conductive material layer on the base substrate on which the second gate insulating layer is formed, such that in the first via-hole, the third conductive material layer is on a side, away from the base substrate, of the second gate insulating layer; and after forming the second gate insulating layer on the base substrate on which the second active layer is formed, the method further comprises:

forming a first planarization layer on the base substrate on which the second gate insulating layer is formed, wherein the third conductive pattern further comprises: a conductive electrode, which is electrically connected to one of the first source and the first drain through the first planarization layer and a via-hole in the second gate insulating layer;

a material of the first active layer comprises poly-silicon, a material of the second active layer comprises an oxide semiconductor, and the first conductive pattern further comprises: a first auxiliary electrode and a first data line, and the third conductive pattern further comprises: a second auxiliary electrode and a second data line; and the first auxiliary electrode, the second auxiliary electrode and the second gate insulating layer form a storage capacitor.

18. The method according to claim 15, wherein after forming the second active layer on the base substrate on which the second conductive pattern is formed, the method further comprises:

forming a second gate insulating layer on the base substrate on which the second active layer is formed, such that in the first via-hole, the second gate insulating layer is on a side, away from the base substrate, of the second active layer; and forming the third conductive material layer on the base substrate on which the second active layer is formed comprises:

forming the third conductive material layer on the base substrate on which the second gate insulating layer is formed, such that in the first via-hole, the third conductive material layer is on a side, away from the base substrate, of the second gate insulating layer.

19. The method according to claim 14, wherein a material of the first active layer comprises poly-silicon, and a material of the second active layer comprises an oxide semiconductor.

20. A display device, comprising: an array substrate, wherein the array substrate comprises: a base substrate, and a first transistor and a second transistor on a side of the base substrate; wherein an orthographic projection of the first transistor on the base substrate and an orthographic projection of the second transistor on the base substrate are non-overlapped;

the first transistor comprises: a first active layer, a first gate, a first source and a first drain, wherein the first source and the first drain are obtained by a single patterning process and are both in contact with the first active layer;

the second transistor comprises: a second active layer, a second gate, a second source and a second drain, wherein the second source and the second drain are on a side, close to the base substrate, of the second active layer, and are both in direct contact with the second active layer, and the second source and the second drain are in different layers; an orthographic projection of the second source on the base substrate and an orthographic projection of the second drain on the base substrate at least partially overlap; and the second gate is on a side, away from the base substrate, of the second active layer; and structures in the first transistor and the second transistor meet at least one of following conditions:

the first gate, and one of the second source and the second drain are in a layer and made from a same material;

the first source, the first drain and the other one of the second source and the second drain are obtained by a single patterning process and made from a same material.

* * * * *